(12) United States Patent
Kim

(10) Patent No.: US 7,046,567 B2
(45) Date of Patent: May 16, 2006

(54) SENSE AMPLIFYING CIRCUIT AND BIT COMPARATOR WITH THE SENSE AMPLIFYING CIRCUIT

(75) Inventor: Min-Su Kim, Kyungki-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 110 days.

(21) Appl. No.: 10/763,163

(22) Filed: Jan. 26, 2004

(65) Prior Publication Data

US 2004/0165463 A1    Aug. 26, 2004

(30) Foreign Application Priority Data

Feb. 26, 2003   (KR) .................. 10-2003-0012041

(51) Int. Cl.
*G11C 7/02* (2006.01)
(52) U.S. Cl. .............. 365/207; 365/205; 365/202; 365/203; 327/51; 327/52; 327/54; 327/55; 327/57
(58) Field of Classification Search ............ 365/205, 365/207, 203, 202; 327/51, 52, 54, 55, 57
See application file for complete search history.

(56) References Cited

U.S. PATENT DOCUMENTS

| | | | | |
|---|---|---|---|---|
| 4,760,559 A | * | 7/1988 | Hidaka et al. | 365/189.05 |
| 4,811,302 A | * | 3/1989 | Koishi | 365/222 |
| 4,926,382 A | * | 5/1990 | Sakui et al. | 365/203 |
| 4,947,376 A | * | 8/1990 | Arimoto et al. | 365/205 |
| 5,015,891 A | * | 5/1991 | Choi | 327/53 |
| 5,231,318 A | * | 7/1993 | Reddy | 327/52 |
| 5,339,273 A | * | 8/1994 | Taguchi | 365/201 |
| 5,343,428 A | * | 8/1994 | Pilo et al. | 365/189.05 |
| 5,426,381 A | * | 6/1995 | Flannagan et al. | 326/66 |
| 5,566,128 A | * | 10/1996 | Magome | 365/230.06 |
| 5,610,543 A | * | 3/1997 | Chang et al. | 327/158 |
| 5,841,706 A | * | 11/1998 | Umezaki et al. | 365/189.11 |
| 6,049,492 A | * | 4/2000 | Vogelsang et al. | 365/196 |

(Continued)

FOREIGN PATENT DOCUMENTS

KR    2001-0009807    2/2001

OTHER PUBLICATIONS

Korean Office Action dated Sep. 30, 2004 and Translation.

*Primary Examiner*—Viet Q. Nguyen
(74) *Attorney, Agent, or Firm*—Harness, Dickey, Pierce

(57) ABSTRACT

A sense amplifying circuit and a bit comparator having the sense amplifying circuit. The sense amplifying circuit may include a selecting unit, a sensing unit, a latching unit, an output unit, and a switching unit. The selecting unit may select one pair from a first pair of a first signal and a first inverted signal and a second pair of a second signal and a second inverted signal, in response to a selection signal and an inverted selection signal. The sensing unit may sense voltage levels of one pair of signals selected from the first pair and the second pair. The latching unit may precharge first and second nodes in response to a clock signal and controls voltage levels of the first and second nodes in response to a sensing result of the sensing unit. The output unit may invert the voltage levels of the first and second nodes to generate first and second output signals. The switching unit is capable of controlling the operation of the selecting unit in response to the clock signal.

28 Claims, 11 Drawing Sheets

U.S. PATENT DOCUMENTS

| | | | |
|---|---|---|---|
| 6,104,653 A * | 8/2000 | Proebsting | 365/203 |
| 6,147,514 A * | 11/2000 | Shiratake | 327/55 |
| 6,188,641 B1 * | 2/2001 | Uchida | 365/233 |
| 6,265,903 B1 * | 7/2001 | Takahashi | 327/7 |
| 6,282,135 B1 * | 8/2001 | Proebsting | 365/203 |
| 6,556,482 B1 * | 4/2003 | Shimoyama et al. | 365/189.01 |
| 6,590,428 B1 * | 7/2003 | Barnes | 327/65 |
| 6,753,720 B1 * | 6/2004 | Kono et al. | 327/538 |

* cited by examiner

SENSE AMPLIFYING CIRCUIT AND BIT COMPARATOR WITH THE SENSE AMPLIFYING CIRCUIT

BACKGROUND OF THE INVENTION

This application claims the priority of Korean Patent Application No. 2003-12041, filed on Feb. 26, 2003, in the Korean Intellectual Property Office, the disclosure of which is incorporated herein in its entirety by reference.

1. Field of the Invention

The present invention generally relates to a semiconductor circuit, and more particularly, to a sense amplifying circuit for detecting and amplifying differential signals with minutely different levels. The present invention also generally relates to a bit comparator employing such a sense amplifying circuit.

2. Description of the Related Art

General sense amplifying circuits are capable of synchronizing two differential signals with minutely different levels with a clock signal, sensing the synchronization signal, amplifying the sensed signal, and outputting the amplified signal.

FIG. 1 illustrates a conventional circuit diagram of a general amplifying circuit. The operation of a sense amplifying circuit 100 will be described with reference to FIG. 1. As is illustrated, two input signals INH and INL with minutely different levels may be applied to the sense amplifying circuit 100. In this case, the input signal INH has a higher voltage level than the input signal INL.

If a clock signal CLK is at a low level, precharge transistors PMP1 and PMP2 precharge first and second nodes N1 and N2, respectively, and NMOS transistors LMN1, LMN2, LM3, and LM4 are turned on.

If the clock signal CLK is transited to a high level, the sense amplifying circuit 100 starts a sensing operation with a switch transistor SWMN turned on. Although the precharge transistors PMP1 and PMP2 are turned on, latch transistors LMP1 and LMP2 keep the first and second nodes N1 and N2 precharged.

Since an NMOS transistor SMN1 receiving the input signal INH allows a larger amount of current to flow than an NMOS transistor SMN2 receiving the input signal INL, a voltage level of the first node N1 is lower than a voltage level of the second node N2.

In other words, the first node N1 is at a low level, and the second node N2 is at a high level. Inverters I1 and I2 invert and output the voltage levels of the first and second nodes N1 and N2.

Accordingly, an output signal OUTH is output as a high level, and an output signal OUTL is output as a low level. As a result, there is an even larger difference between the voltage levels of the output signals OUTH and OUTL.

However, if a sense amplifying circuit should select and amplify one pair of differential signals from two pairs of differential signals, because the two pairs of differential signals are low-noise signals having a small swing, a general sense amplifying circuit generally must amplify both pairs and then select one pair. This may create a logic burden on a rear end of the sense amplifying circuit.

FIG. 2 illustrates a conventional circuit diagram of a general bit comparator.

The general bit comparator compares a tag value with address data input to a contents address memory (CAM) in a cache memory. The CAM is capable of storing data input from an external source, and comparing the stored data with address data input from an external source to determine whether the stored data coincides with the address data. The data stored in the CAM is generally called a tag, and the bit comparator compares the tag with input address data.

The operation of the general bit comparator will be explained with reference to FIG. 2. A data maintainer 230 has a latch structure in which input nodes of inverters ID1 and ID2 are connected to output nodes of the inverters ID1 and ID2, and receive and store data DATA and inverted data INDATA from a pair of bit lines BL and BLB via transistors CMN1 and CMN2 controlled by a word line WL. This value is a tag.

Assuming that the data DATA has a low level, the inverted data INDATA has a high level, and address data INH and INL that do not coincide with the data DATA and inverted data INDATA are input. In other words, the address data INH is at a high level, and the address data INL is at a low level.

The address data INH and INL is input to a driver 220 via a sense amplifying circuit 210 which operates in synchronicity with a clock signal CLK. The sense amplifying circuit 210 generally has the same structure as the general sense amplifying circuit 100 shown in FIG. 1, and the address data INH and INL is amplified through the sense amplifying circuit 210 and the driver 220.

When the data DATA and the inverted data INDATA is applied to transmission gates TG1 and TG2, respectively, the transmission gate TG1 is turned on, and the transmission gate TG2 is turned off. The address data INH with the high level is output as a match signal MATL via the transmission gate TG1. The address data INL with the low level is not output because the transmission gate TG2 is turned off.

Outputting the match signal MATL at a high level indicates that the address data INH and INL input to a bit comparator 200 may each have a different level from the data DATA and the inverted data INDATA. Outputting the match signal MATL at a low level indicates that the address data INH and INL input to the bit comparator 200 each have the same level as the data DATA and the inverted data INDATA.

A general bit comparator normally generates a match signal by amplifying input address data through a sense amplifying circuit and a driver, and comparing the input address data with stored data. As a result, a significant time is taken from the input of the address data to the output of the match signal. This is problematic in a cache memory which is required to operate at a high speed.

SUMMARY OF THE INVENTION

An exemplary embodiment of the present invention may provide a sense amplifying circuit capable of selecting one pair of two pairs of differential signals and amplifying the selected pair of differential signals.

An exemplary embodiment of the present invention is also capable of providing a bit comparator for operating at a high speed by including a sense amplifying circuit.

According to an exemplary embodiment of the present invention, a sense amplifying circuit my include a selecting unit for selecting one pair from a first pair of a first signal and a first inverted signal and a second pair of a second signal and a second inverted signal, the selecting unit selecting the one pair in response to a selection signal and an inverted selection signal; a sensing unit for sensing voltage levels of one pair of signals selected from the first pair and the second pair; a latching unit for precharging first and second nodes in response to a clock signal and for controls voltage levels of the first and second nodes in response to a sensing result of the sensing unit; an output unit for inverts the voltage levels of the first and second nodes to generate first and second output signals; and a switching unit for controlling the operation of the selecting unit in response to the clock signal.

According to an exemplary embodiment of the present invention, a sense amplifying circuit may include a selecting unit for selecting one pair from a first pair of a first signal and a first inverted signal and a second pair of a second signal and a second inverted signal, in response to a first level of a clock signal, a selection signal, and an inverted selection signal; a sensing unit for sensing voltage levels of one pair of signals selected from the first and second pairs; a latching unit for precharging first and second nodes in response to a second level of the clock signal and controls voltage levels of the first and second nodes in response to a sensing result of the sensing unit; and an output unit for inverting the voltage levels of the first and second nodes to generate first and second output signals.

According to an exemplary embodiment of the present invention, a bit comparator may include a random access memory cell for receiving and storing data and inverted data having an opposite level to the data from a pair of data lines to generate a selection signal and an inverted selection signal in response to a control signal; a selecting unit for selecting one pair from a first pair of first signal and first inverted signal and a second pair of second signal and second inverted signal in response to a first level of a clock signal, the selection signal, and the inverted selection signal; a sensing unit for sensing voltage levels of one pair of signals selected from the first and second pairs; a latching unit for precharging first and second nodes in response to a second level of the clock signal and controls voltage levels of the first and second nodes in response to a sensing result of the sensing unit; and an output unit for inverting the voltage levels of the first and second nodes to generate first and second output signals and determines in response to a level of the second output signal whether the data and the inverted data coincide with the first signal and the first inverted signal.

According to an exemplary embodiment of the present invention, an apparatus may include a selecting unit for selecting a signal pair from at least two pairs of signals, the selecting unit selecting the signal pair based upon at least one selection signal; and amplifying circuitry for amplifying only the pair selected from the at least two pairs of signals.

According to an exemplary embodiment of the present invention, a method includes selecting a signal pair from at least two pairs of signals based upon at least one selection signal; and amplifying only the signal pair selected from the at least two pairs of signals.

BRIEF DESCRIPTION OF THE DRAWINGS

Exemplary embodiments of the present invention will become more fully understood from the detailed description given hereinbelow and the accompanying drawings which are given by way of illustration only, and thus are not limitative of the present invention, and wherein.

DETAILED DESCRIPTION OF EXEMPLARY EMBODIMENTS

Figure 1:
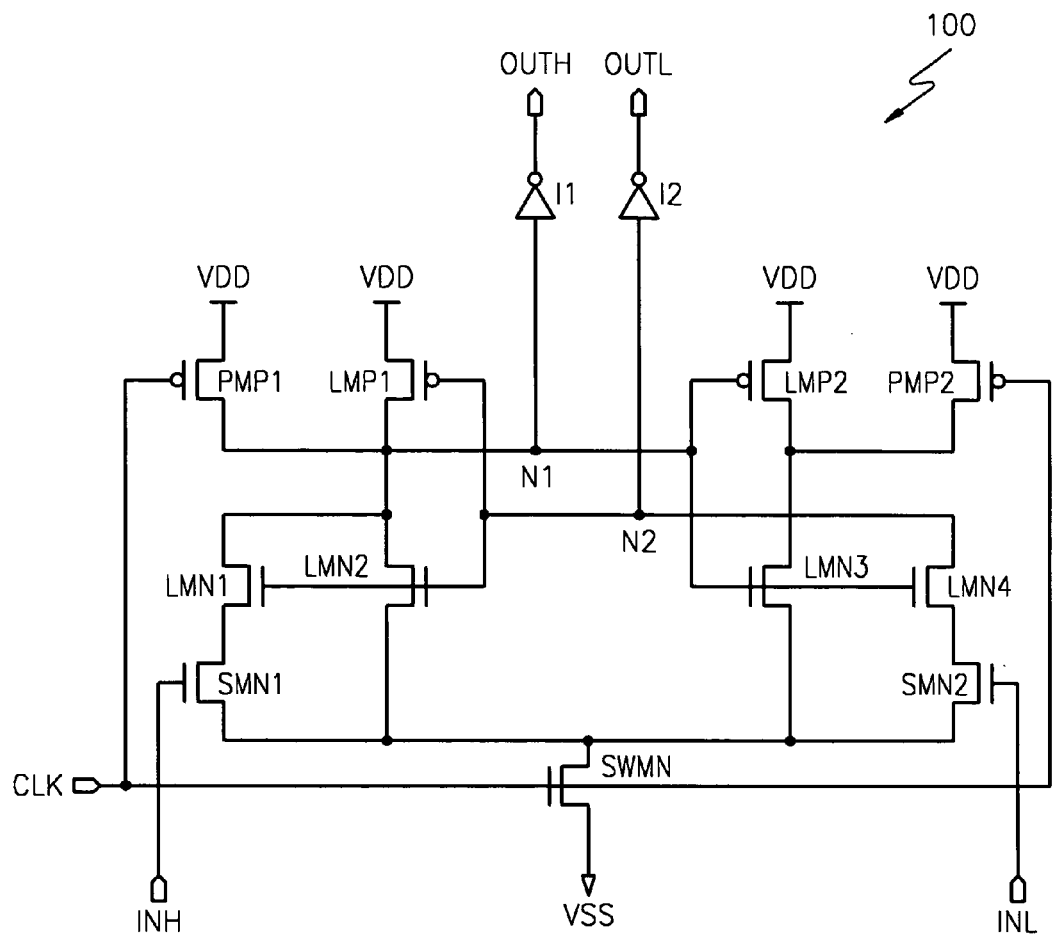
FIG. 1 illustrates a conventional circuit diagram of a general sense amplifying circuit.

It may be useful to refer to the attached drawings in order to gain understanding of the merits of exemplary embodiments of the present invention, the operation thereof, and the objectives accomplished thereby. However, those of ordinary skill in the art appreciate the exemplary embodiments illustrated and described herein have been given by way of example only and may not be considered as limiting of the claimed invention.

Hereinafter, exemplary embodiments of the present invention will be explained with reference to the attached drawings. Like reference numerals denote like members throughout the drawings.

Figure 3:
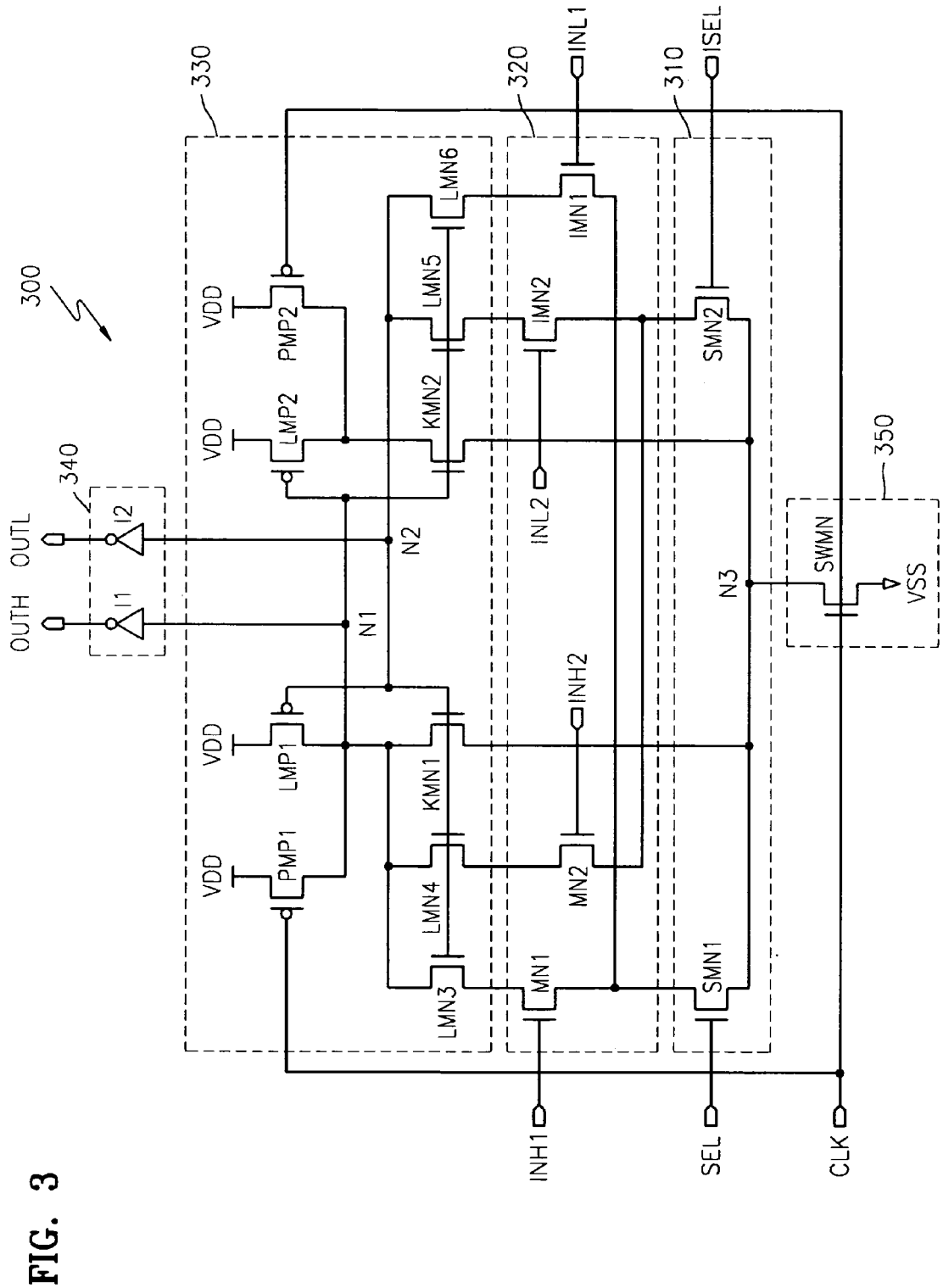
FIG. 3 illustrates a circuit diagram of a sense amplifying circuit according to an exemplary embodiment of the present invention.

FIG. 3 illustrates a circuit diagram of a sense amplifying circuit according to an exemplary embodiment of the present invention. Referring to FIG. 3, a sense amplifying circuit 300 may include a selecting unit 310, a sensing unit 320, a latching unit 330, an output unit 340, and a switching unit 350.

The latching unit 330 may precharge first and second nodes N1 and N2 in response to a clock signal CLK and may control voltage levels of the first and second nodes N1 and N2 in response to a sensing result of the sensing unit 320.

In more detail, the latching unit 330 may include first and second precharge transistors PMP1 and PMP2, and first, second, third, fourth, fifth, and sixth latch transistors LMP1, LMP2, LMN3, LMN4, LMN5, and LMN6. The first precharge transistor PMP1 has a first end connected to a power voltage VDD, a second end connected to a first node N1, and a gate connected to the clock signal CLK. The second precharge transistor PMP2 has a first end connected to the power voltage VDD, a second end connected to a second node N2, and a gate connected to the clock signal CLK. The first latch transistor LMP1 has a first end connected to the power voltage VDD, a second end connected to the first node N1, and a gate connected to the second node N2. The second latch transistor LMP2 has a first end connected to the power voltage VDD, a second end connected to the second node N2, and a gate connected to the first node N1. The third and fourth latch transistors LMN3 and LMN4 have first ends connected to the first node N1 and gates connected to the second node N2. The fifth and sixth latch transistors LMN5 and LMN6 have first ends connected to the second node N2 and gates connected to the first node N1.

The latching unit 330 may further include a first current pass transistor KMN1 which has a first end connected to the first node N1, a second end connected to the switching unit 350, and a gate connected to the second node N2, and a second current pass transistor KMN2 which has a first end connected to the second node N2, a second end connected to the switching unit 350, and a gate connected to the first node N1.

The sensing unit 320 is capable of sensing voltage levels of one pair of signals selected from a first pair of signals INH1 and INL1 and a second pair of signals IN2 and INL2. The sensing unit 320 includes first and second sense transistors MN1 and MN2, and first and second inverted sense transistors IMN1 and IMN2. The first sense transistor MN1 has a first end connected to the second end of the third latch transistor LMN3 and a gate connected to the first signal INH1. The first inverted sense transistor IMN1 has a first end connected to the second end of the sixth latch transistor LMN6 and a gate connected to the first inverted signal INL1. The second transistor MN2 has a first end connected to the second end of the fourth latch transistor LMN4 and a gage connected to the second signal INH2. The second inverted sense transistor IMN3 has a first end connected to the second end of the fifth latch transistor LMN5 and a gate connected to the first inverted signal INL1.

The selecting unit 310 may select one pair from the first pair of first signal INH1 and first inverted signal INL1 and the second pair of second signal INH2 and inverted signal INL1 in response to a selection signal SEL and an inverted selection signal ISEL.

To be more specific, the selecting unit 310 may further include first and second select transistors SMN1 and SMN2. The first select transistor SMN1 has a first end connected to the second end of the first sense transistor MN1 and the second end of the first inverted sense transistor IMN1, a gate connected to the selection signal SEL, and a second end connected to a third node N3. The second select transistor SMN2 has a first end connected to the second end of the second sense transistor MN2 and the second end of the second inverted sense transistor IMN2, a gate connected to the inverted selection signal ISEL, and a second end connected to the third node N3.

The output unit 340 inverts voltage levels of the first and second nodes N1 and N2 to output first and second output signals OUTH and OUTL. The switching unit 350 controls the operation of the selecting unit 310 in response to the clock signal CLK.

The switching unit 350 may be a switch transistor SWMN which has a first end connected to the third node N3, a gate connected to the clock signal CLK, and a second end connected to a ground voltage VSS.

Hereinafter, the operation of the sense amplifying circuit 300 will be described with reference to FIG. 3.

Unlike the sense amplifying circuit 100 of FIG. 1, the sense amplifying circuit 300 of FIG. 3 receives two pairs of differential signals, i.e., a first pair of first signal INH1 and first inverted signal INL1 and a second pair of second signal INH2 and second inverted signal INL2. Since the sense amplifying circuit 300 according to an exemplary embodiment of the present invention selects and amplifies one of the two pairs of differential signals, no burden is generally imposed on a rear end of the sense amplifying circuit 300.

When the clock signal CLK is at a low level, the first and second precharge transistors PMP1 and PMP2 are turned on, the first and second nodes N1 and N2 are precharged, and the third, fourth, fifth, and sixth transistors LMN3, LMN4, LMN5, and LMN6 are turned on.

When the clock signal CLK is transited to a high level, the switch transistor SWMN of the switching unit 350 is turned on. The selecting unit 310 selects one pair from the first pair of first signal INH1 and first inverted signal INL1 and the second pair of second signal INH2 and second inverted signal INL2 in response to the selection signal SEL and the inverted selection signal ISEL.

When the selection signal SEL has a high level, and the inverted signal ISEL has a low level, the first select transistor SMN1 is turned on, and the second select transistor SMN2 is turned off.

When the first select transistor SMN1 is turned on, the first sense transistor MN1 and the first inverted sense transistor IMN1 of the sensing unit 320 operate, and the second sense transistor MN2 and the second inverted sense transistor IMN2 of the sensing unit 320 do not operate. Accordingly, the first signal INH1 and the first inverted signal INL1 input to the gates of the first sense transistor MN1 and the first inverted sense transistor IMN1 are sensed, while the second signal INH2 and the second inverted signal INL2 are not sensed.

When the voltage level of the first signal INH1 is higher than the voltage level of the first inverted signal INL1, the third, fourth, fifth, and sixth latch transistors LMN3, LMN4, LMN5, and LMN6 are turned on. However, since the second sense transistor MN2 and the second inverted sense transistor IMN2 do not operate, the fourth and fifth latch transistors LMN4 and LMN5 do not operate.

In addition, since the voltage level of the first signal INH1 is higher than the voltage level of the first inverted signal INL1, the first sense transistor MN1 allows a larger amount of current to flow than the first inverted sense transistor IMN1. Thus, a voltage level of the first node N1 becomes lower than a voltage level of the second node N2.

The output unit 340 inverts the voltage levels of the first and second nodes N1 and N2 using inverters I1 and I2 to output first and second output signals OUTH and OUTL. The voltage level of the first output signal OUTH is higher than the voltage level of the second output signal OUTL. Consequently, the first signal INH1 and the first inverted signal INL1 are amplified and output as the first and second output signals OUTH and OUTL.

In contrast, when the selection signal SEL has a low level and the inverted selection signal ISEL has a high level, the second sense transistor MN2 and the second inverted sense transistor IMN2 operate, and thus the second signal INH2 and the second inverted signal INL2 are amplified and output.

Accordingly, although two pairs of differential signals are input to the sense amplifying circuit 300, generally no burden is imposed on the rear end of the sense amplifying circuit 300.

Figure 4:
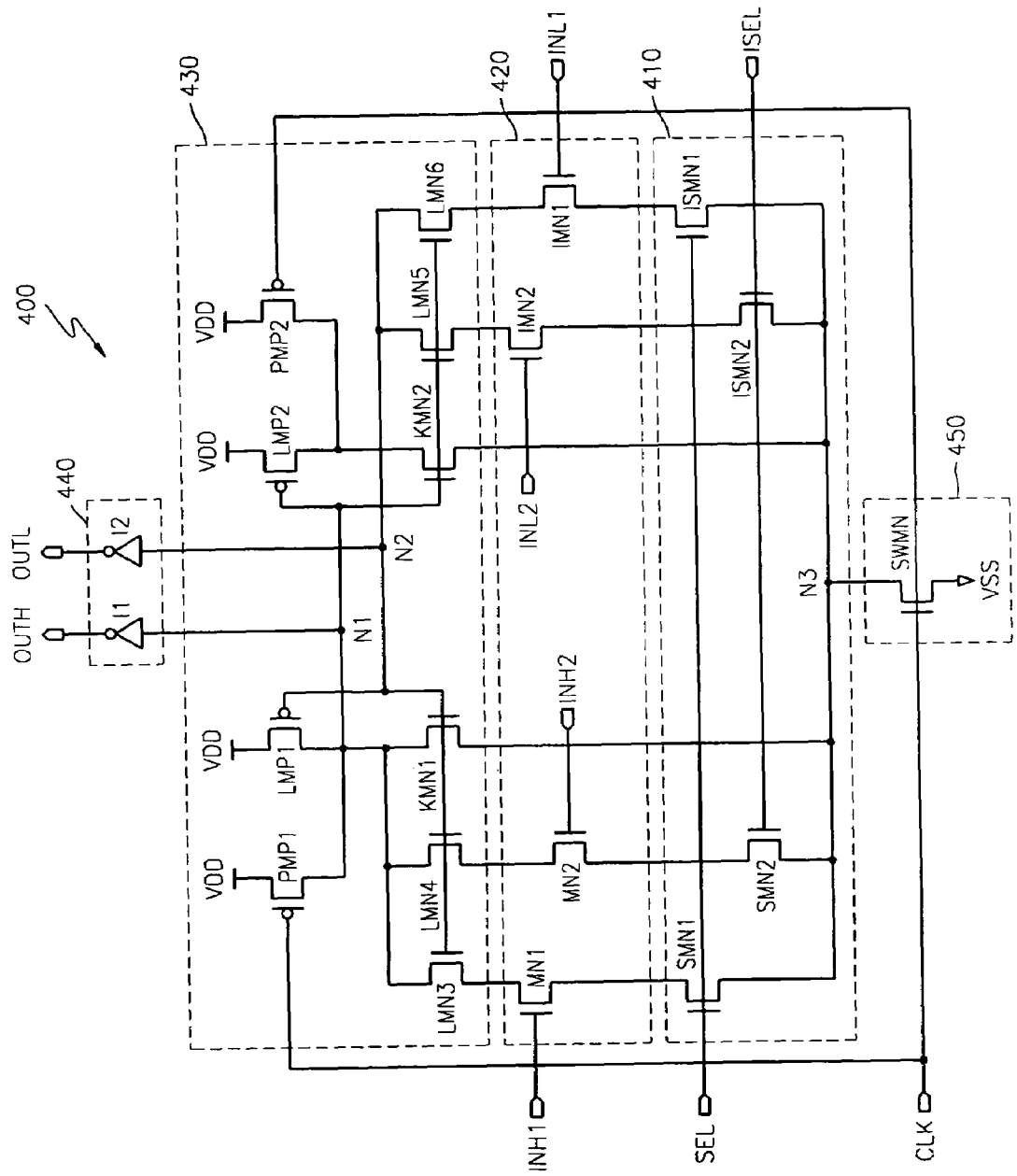
FIG. 4 illustrates is a modified circuit diagram of the sense amplifying circuit illustrated in FIG. 3.

FIG. 4 illustrates is a modified circuit diagram of the sense amplifying circuit illustrated in FIG. 3.

A sense amplifying circuit 400 of FIG. 4 is substantially identical to the sense amplifying circuit 300 except that a selecting unit 410 has a different structure from the selecting unit 310.

The selecting unit 410 may include first and second select transistors SMN1 and SMN2, and first and second inverted select transistors ISMN1 and ISMN2. The first select transistor SMN1 has a first end connected to a second end of the first sense transistor MN1, a gate connected to a selection signal SEL, and a second end connected to a third node N3. The first inverted select transistor ISMN1 has a first end connected to a second end of the first inverted sense transistor IMN1, a gate connected to the selection signal SEL, and a second end connected to the third node N3. The second select transistor SMN2 has a first end connected to a second end of the second sense transistor MN2, a gate connected to an inverted signal ISEL, and a second end connected to the third node N3. The second inverted select transistor ISMN2 has a first end connected to a second end of the second inverted sense transistor IMN2, a gate connected to the inverted signal ISEL, and a second end connected to the third node N3.

The first select transistor SMN1 of the selecting unit 310 is connected to the first sense transistor MN1 and the first inverted sense transistor IMN1 to control the first sense transistor MN1 and the first inverted sense transistor IMN1.

The first sense transistor MN1 of the selecting unit 410 is controlled by the first select transistor SMN1, and the first inverted sense transistor IMN1 is controlled by the first inverted select transistor ISMN1. The second sense transistor MN2 is controlled by the second select transistor SMN2, and the second inverted sense transistor IMN2 is controlled by the second inverted select transistor ISMN2.

It is understood by those of ordinary skill in the art that the selecting unit 410 of FIG. 4 performs substantially the same functions as the selecting unit 310 illustrated in FIG. 3. Thus, the functions of the selecting unit 410 will not be explained herein.

First and second precharge transistors PMP1 and PMP2, and first and second latch transistors LMP1 and LMP2 are PMOS transistors. Third, fourth, fifth, and sixth transistors LMN3, LMN4, LMN5, and LMN6, the first and second sense transistors MN1 and MN2, the first and second inverted sense transistors IMN1 and IMN2, the first and second select transistors SMN1 and SMN2, the first and second inverted select transistors ISMN1 and ISMN2, and a switch transistor SWMN are NMOS transistors.

It is understood by those of ordinary skill in the art that a sense amplifying circuit may be constituted by changing PMOS transistors into NMOS transistors or NMOS transistors into PMOS transistors.

Figure 5:
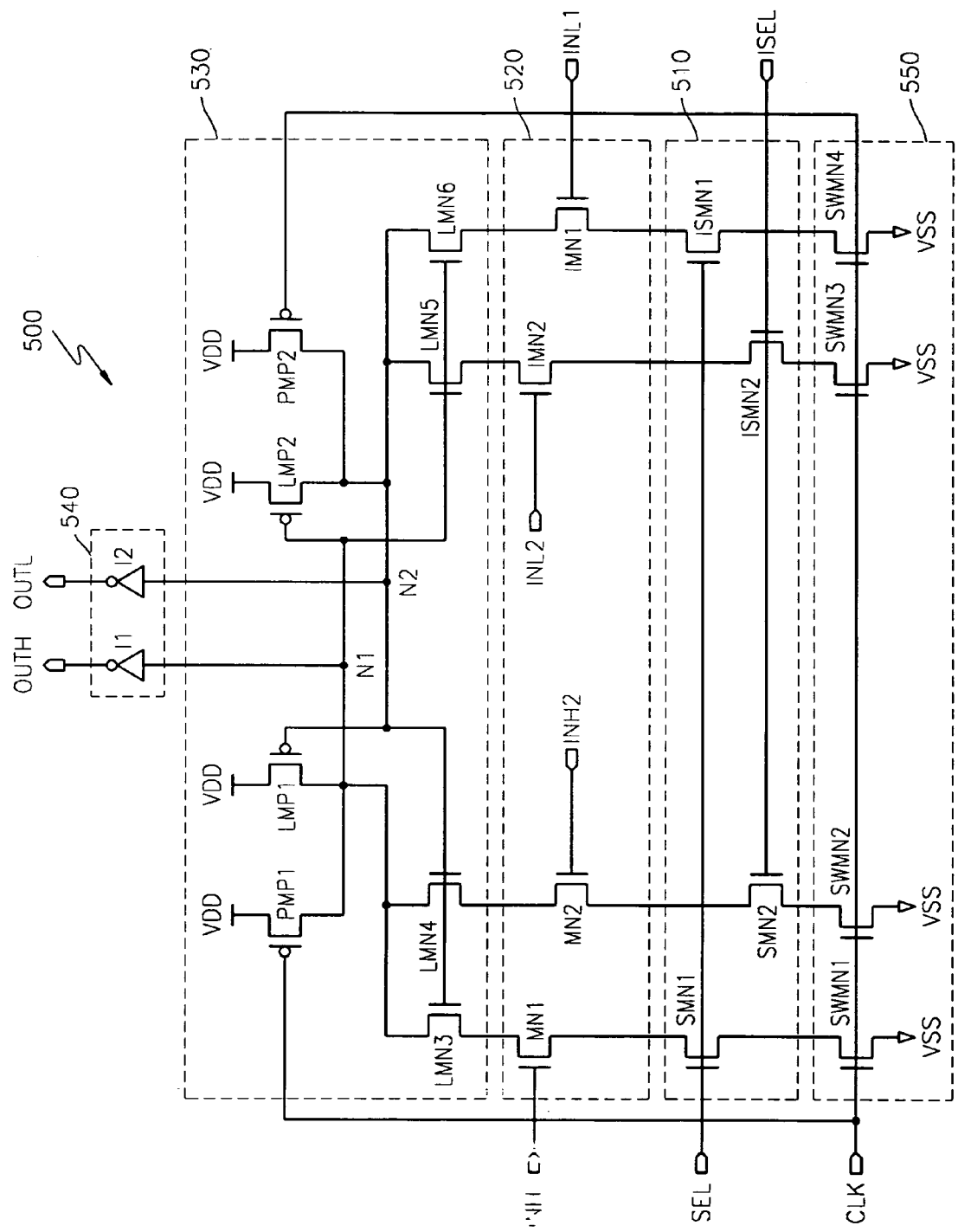
FIG. 5 illustrates a modified circuit diagram of the sense amplifying circuit illustrated in FIG. 3.

FIG. 5 illustrates a modified circuit diagram of the sense amplifying circuit illustrated in FIG. 3.

A sense amplifying circuit 500 of FIG. 5 is substantially the same as the sense amplifying circuit 400 except that a switching unit 550 has a different structure from the switching unit 450.

Referring to FIG. 5, unlike the switching unit 450, switch transistors SWMN1, SWMN2, SWMN3, and SWMN4 of the switching unit 550 are connected to first and second select transistors SMN1 and SMN2, and first and second inverted select transistors ISMN1, and ISMN2, respectively.

It is understood by those of ordinary skill in the art that the switching unit 550 of FIG. 5 performs substantially the same functions as the switching unit 450 of FIG. 4. Thus, the functions of the switching unit 550 will not be explained herein.

Figure 6:
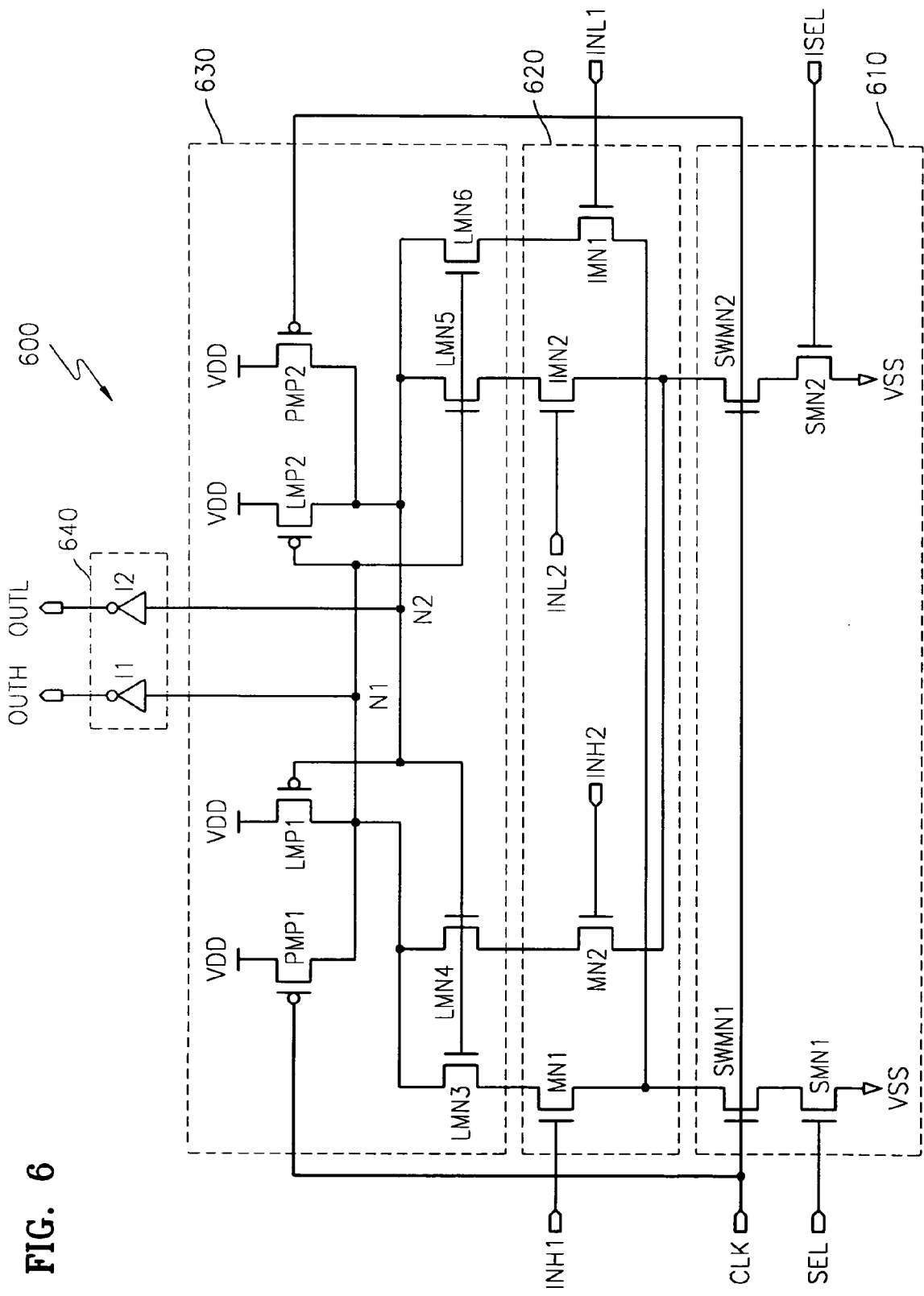
FIG. 6 illustrates a circuit diagram of a sense amplifying circuit according to another exemplary embodiment of the present invention.

FIG. 6 illustrates a circuit diagram of a sense amplifying circuit according to another exemplary embodiment of the present invention.

Referring to FIG. 6, a sense amplifying circuit 600 may include a selecting unit 610, a sensing unit 620, a latching unit 630, and an output unit 640.

The latching unit 630 precharges first and second nodes N1 and N2 in response to a second level of a clock signal CLK and controls voltage levels of the first and second nodes N1 and N2 in response to a sensing result of the sensing unit 620.

The structure of the latching unit 630 is substantially the same as that of the latching unit 330 of the sense amplifying circuit 300 of FIG. 3 and thus will not be explained again.

The sensing unit 620 is capable of sensing voltage levels of one pair of signals selected from a first pair of first signal INH1 and first inverted signal INL1 and a second pair of second signal INH2 and second inverted signal INL2. The structure of the sensing unit 620 is substantially identical to that of the sensing unit 320 of the sense amplifying circuit 300 of FIG. 3 and thus will not be described again.

The selecting unit 610 is capable of selecting one pair from the first pair of first signal INH1 and first inverted signal INL1 and the second pair of second signal INH2 and second inverted signal INL2 in response to a first level of the clock signal CLK, a selection signal SEL, and an inverted signal ISEL.

In more detail, the selecting unit 610 may include first and second switch transistors SWMN1 and SWMN2, and first and second select transistors SMN1 and SMN2. The first switch transistor SWMN1 has a first end connected to a second end of a first sense transistor MN1 and a second end of a first inverted sense transistor IMN1, and a gate connected to the clock signal CLK. The second switch transistor SWMN2 has a first end connected to a second end of a second sense transistor MN2 and a second end of a second inverted sense transistor IMN2, and a gate connected to the clock signal CLK. The first select transistor SMN1 has a first end connected to a second end of the first switch transistor SWMN1, a gate connected to the selection signal SEL, and a second end connected to a ground voltage VSS. The second select transistor SMN2 has a first end connected to a second end of the second switch transistor SWMN2, a gate connected to the inverted selection signal ISEL, and a second end connected to the ground voltage VSS.

The output unit 640 inverts the voltage levels of the first and second nodes N1 and N2 to output first and second output signals OUTH and OUTL.

The operation of the sense amplifying circuit 600 will be described with reference to FIG. 6.

The sense amplifying circuit 600 of FIG. 6 is different from the sense amplifying circuit 300 of FIG. 3 in positions of the first and second switch transistors SWMN1 and SWMN2 and the first and second select transistors SMN1 and SMN2. In other words, in the sense amplifying circuit 300, the first and second select transistors SMN1 and SMN2 are directly connected to the sensing unit 320, and the switch transistor SWMN is connected between the selecting unit 310 and the ground voltage VSS.

In contrast, in the sense amplifying circuit 600 of FIG. 6, the first and second switch transistors SWMN1 and SWMN2 are directly connected to the sensing unit 620, and the first and second select transistors SMN1 and SMN2 are connected to the ground voltage VSS.

When the clock signal CLK is at a low level, the latching unit 630 precharges the first and second nodes N1 and N2. When the clock signal CLK is transited to a high level, the first and second switch transistors SWMN1 and SWMN2 are turned on. For convenience, the high level of the clock signal CLK is called a first level and the low level of the clock signal CLK is called a second level.

When the first and second switch transistors SWMN1 and SWMN2 are turned on, the selection signal SEL with a high level and the inverted selection signal ISEL with a low level are input. Then, the first select transistor SMN1 is turned on, and the second select transistor SMN21 is turned off.

Although the second switch transistor SWMN2 is turned on, the second select transistor SMN2 is turned off. Thus, the second sense transistor MN2 and the second inverted sense transistor IMN2 to which the second signal INH2 and the second inverted signal INL2 are applied, respectively, do not operate, while the first sense transistor MN1 and the first inverted sense transistor IMN1 to which the first signal INH1 and the first inverted signal INL1 are applied, respectively, operate.

When a voltage level of the first signal INH1 is higher than a voltage level of the first inverted signal INL1, third, fourth, fifth, and sixth latch transistors LMN3, LMN4, LMN5, and LMN6 are turned on. However, since the second sense transistor MN2 and the second inverted sense transistor IMN2 do not operate, the fourth and fifth latch transistors LMN4 and LMN5 do not operate.

Since the voltage level of the first signal INH1 is higher than the voltage level of the first inverted signal INL1, the first sense transistor MN1 allows a larger amount of current to flow than the first inverted sense transistor IMN1. Then, the voltage level of the first node N1 is lower than the voltage level of the second node N2.

The output unit 640 inverts the voltage levels of the first and second nodes N1 and N2 using inverters 11 and 12 to output the first and second output signals OUTH and OUTL. A voltage level of the first output signal OUTH is higher than a voltage level of the second output signal OUTL. As a result, the first signal INH1 and the first inverted signal INL1 are amplified and output as the first and second output signals OUTH and OUTL, respectively.

When the selection signal SEL has a low level and the inverted signal ISEL has a low level, the second sense transistor MN2 and the second inverted sense transistor IMN2 operate. Thus, the second signal INH2 and the second inverted signal INL2 are amplified and output.

Accordingly, although two pairs of differential signals are input to the sense amplifying circuit 600 of FIG. 6, a significant burden is generally not imposed on the rear end of the sense amplifying circuit 600.

Figure 7:
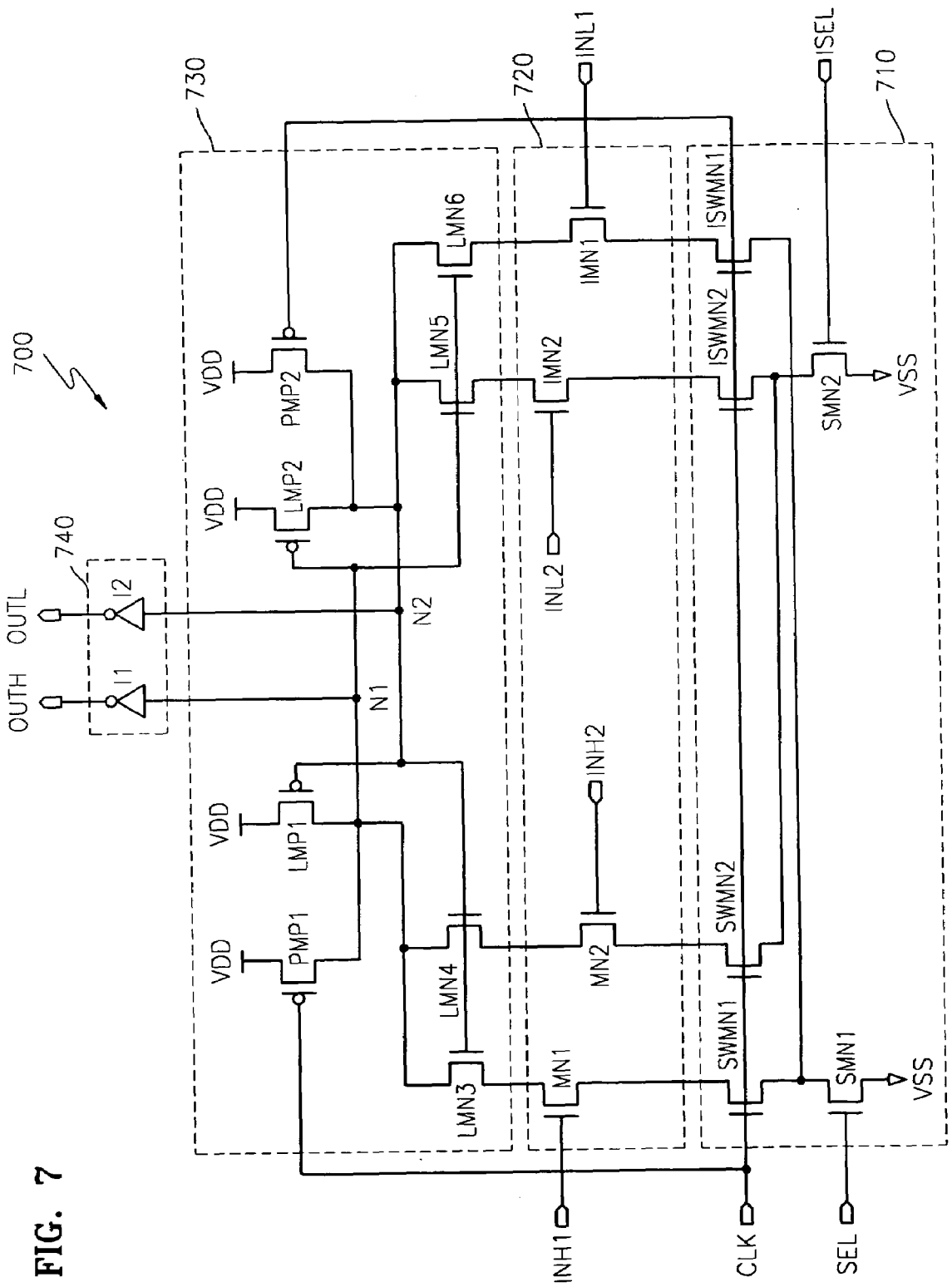
FIG. 7 illustrates a modified circuit diagram of the sense amplifying circuit illustrated in FIG. 6.

FIG. 7 illustrates a modified circuit diagram of the sense amplifying circuit illustrated in FIG. 6.

Referring to FIG. 7, first and second switch transistors SWMN1 and SWMN2, and first and second inverted switch transistors ISWMN1 and ISWMN2 are connected to first and second sense transistors MN1 and MN2, and first and second inverted sense transistors IMN1 and IMN2, respectively.

It is understood by those of ordinary skill in the art that a selecting unit 710 of FIG. 7 performs substantially the same functions as the selecting unit 610 of FIG. 6. Thus, the functions of the selecting unit 710 will not be explained again.

Figure 8:
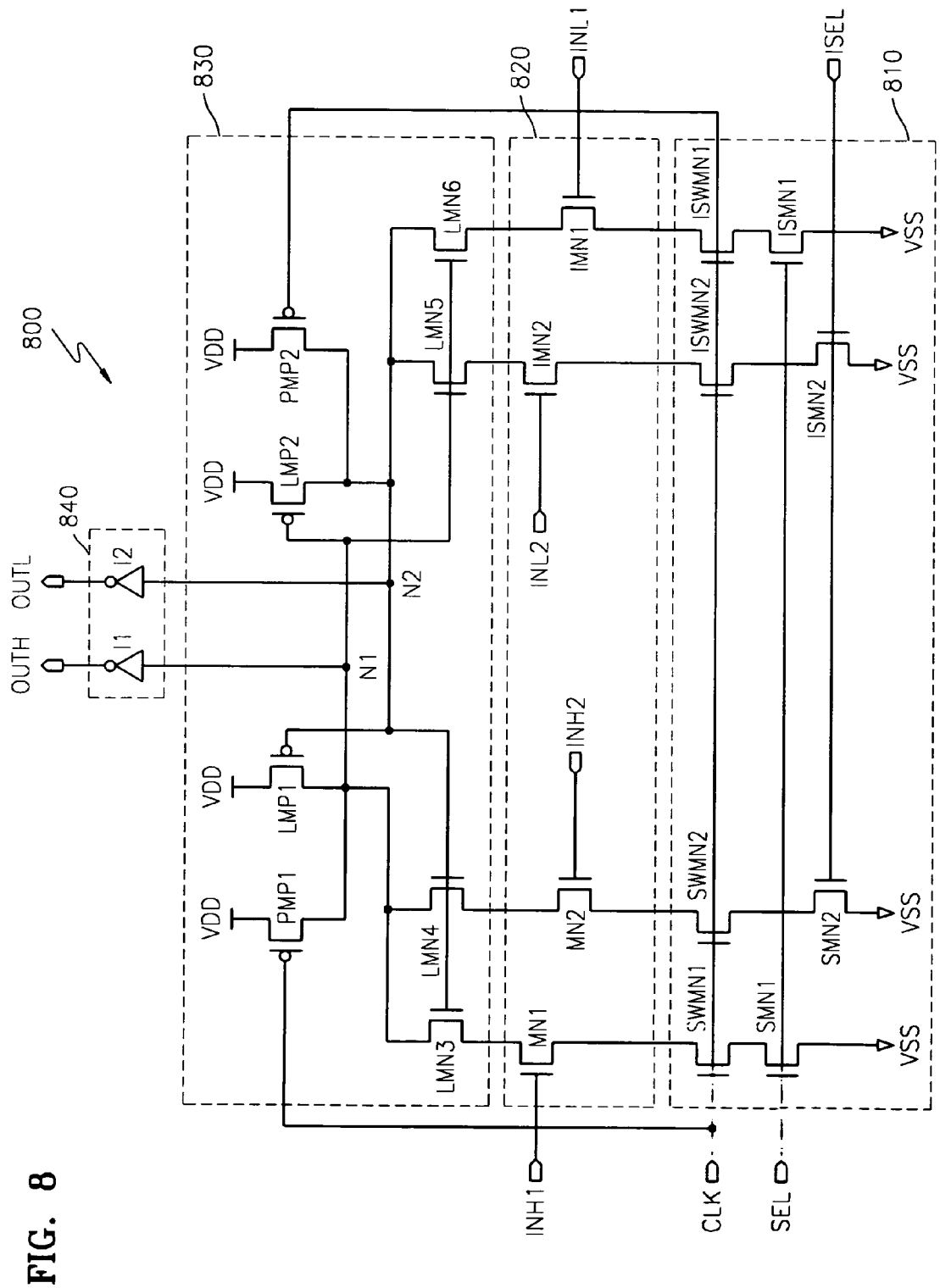
FIG. 8 illustrates a modified circuit diagram of the sense amplifying circuit illustrated in FIG. 6.

FIG. 8 illustrates a modified circuit diagram of the sense amplifying circuit illustrated in FIG. 6.

Referring to FIG. 8, a selecting unit 810 may include first and second switch transistors SWMN1 and SWMN2, and first and second inverted switch transistors ISWMN1 and ISWMN2, which have substantially the same structures as the first and second switches SWMN1 and SWMN2 and the first and second inverted switch transistors ISWMN1 and ISWMN2 of the selecting unit 710 of FIG. 7, and first and second select transistors SMN1 and SMN2 and first and second inverted select transistors ISMN1 and ISMN2 which are connected to the first and second switch transistors SWMN1 and SWMN2 and the first and second inverted switch transistors ISWMN1 and ISWMN2, respectively.

It is understood by those of ordinary skill in the art that the first and second select transistors SMN1 and SMN2 and the first and second inverted select transistors ISMN1 and ISMN2 of FIG. 8 have substantially the same functions as the first and second select transistors SMN1 and SMN2 of FIG. 6. Thus, the functions of the first and second select transistors SMN1 and SMN2 and the first and second inverted select transistors ISMN1 and ISMN2 of FIG. 8 will not be explained again.

Figure 9:
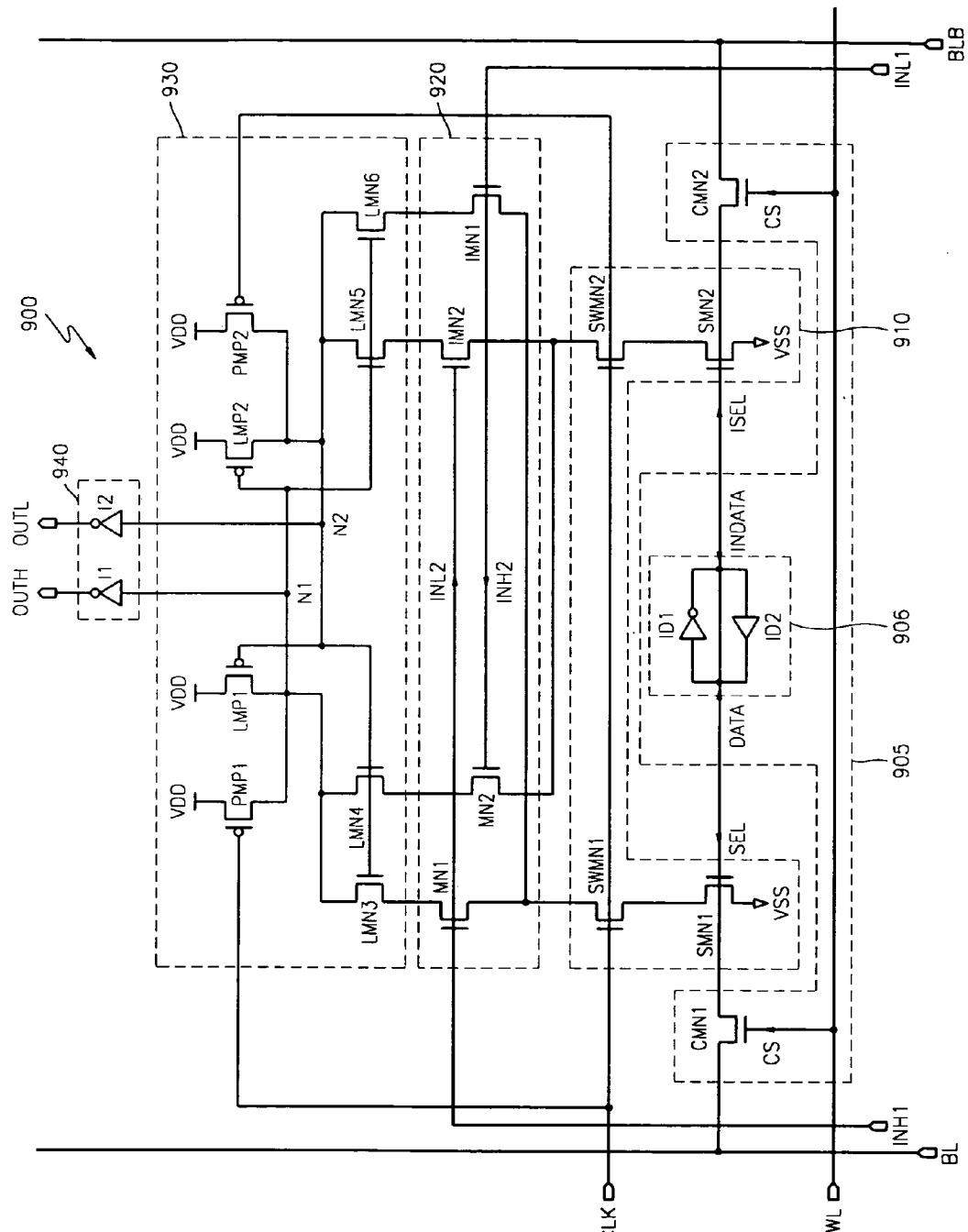
FIG. 9 illustrates a circuit diagram of a bit comparator according to another exemplary embodiment of the present invention.

FIG. 9 illustrates a circuit diagram of a bit comparator according to another exemplary embodiment of the present invention. Referring to FIG. 9, a bit comparator 900 may include a random access memory (RAM) cell 905, a selecting unit 910, a sensing unit 920, a latching unit 930, and an output unit 940.

The RAM cell 905 receives and stores data DATA and inverted data INDATA having an opposite level to the data DATA from a pair of data lines to generate a selection signal SEL and an inverted selection signal ISEL in response to a control signal CS.

In more detail, the RAM cell 905 includes a data maintainer 906 having first and second inverters ID1 and ID2, and first and second control transistors CMN1 and CMN2. Output of the first inverter ID1 is connected to input of the second inverter ID2, while input of the first inverter ID1 is connected to output of the second inverter ID2. The first control transistor CMN1 transmits the data DATA to an input node of the first inverter ID1 via one of a pair of data lines in response to the control signal CS. The second control transistor CMN2 transmits the inverted data DATA to an input node of the second inverter ID2 via the other one of the pair of data lines in response to the control signal CS. The pair of data lines is a pair of bit lines BL and BLB.

The selecting unit 910 selects one pair from a first pair of first signal INH1 and first inverted signal INL1 and a second pair of second signal INH2 and second inverted signal INL2, in response to a first level of a clock signal CLK, the selection signal SEL, and the inverted selection signal ISEL.

The data DATA is equal to the selection signal SEL, and the inverted data INDATA is equal to the inverted selection signal ISEL. The first signal INH1 is identical to the second inverted signal INL2, and the second signal INH2 is identical to the first inverted signal INL1. The first signal INH1 has an opposite level to the first inverted signal INL1, and the first signal INH1 and the first inverted signal INL1 are address data input to the bit comparator 900.

The sensing unit 920 senses voltage levels of one pair selected from the first pair of first signal INH1 and first inverted signal INL1 and the second pair of second signal INH2 and second inverted signal INL2. When the clock signal CLK and the selection signal SEL are at a first level, in the sensing unit 920, a first sense transistor MN1 having a gate to which the first signal INH1 is applied and a first inverted sense transistor IMN1 having a gate to which the first inverted signal INL1 is applied are turned on, and a source of the first sense transistor MN1 is connected to a source of the first inverted sense transistor IMN1.

When the clock signal CLK and the inverted selection signal ISEL are at the first level, a second sense transistor MN2 having a gate to which the second signal INH2 is applied and a second inverted sense transistor IMN2 having a gate to which the second inverted signal INL2 is applied are turned on, and a source of the second sense transistor MN2 is connected to a source of the second inverted sense transistor IMN2.

The latching unit 930 precharges first and second nodes N1 and N2 in response to a second level of the clock signal CLK and controls voltage levels of the first and second nodes N1 and N2 in response to a sensing result of the sensing unit 920.

The output unit 940 inverts the voltage levels of the first and second nodes N1 and N2 to generate first and second output signals OUTH and OUTL and determines in response to a level of the second output signal OUTL whether the data DATA and the inverted data INDATA coincide with the first signal INH1 and the first inverted signal INL1.

Hereinafter, the operation of the bit comparator 900 will be explained in detail with reference to FIG. 9.

As previously described with reference to FIG. 2, the general bit comparator 200 may generate the match signal by amplifying the input address data through the sense amplifying circuit 210 and the driver 220 and comparing the input address data with stored data. Thus, it takes a long time from input of the address data to output of the match signal.

Figure 2:
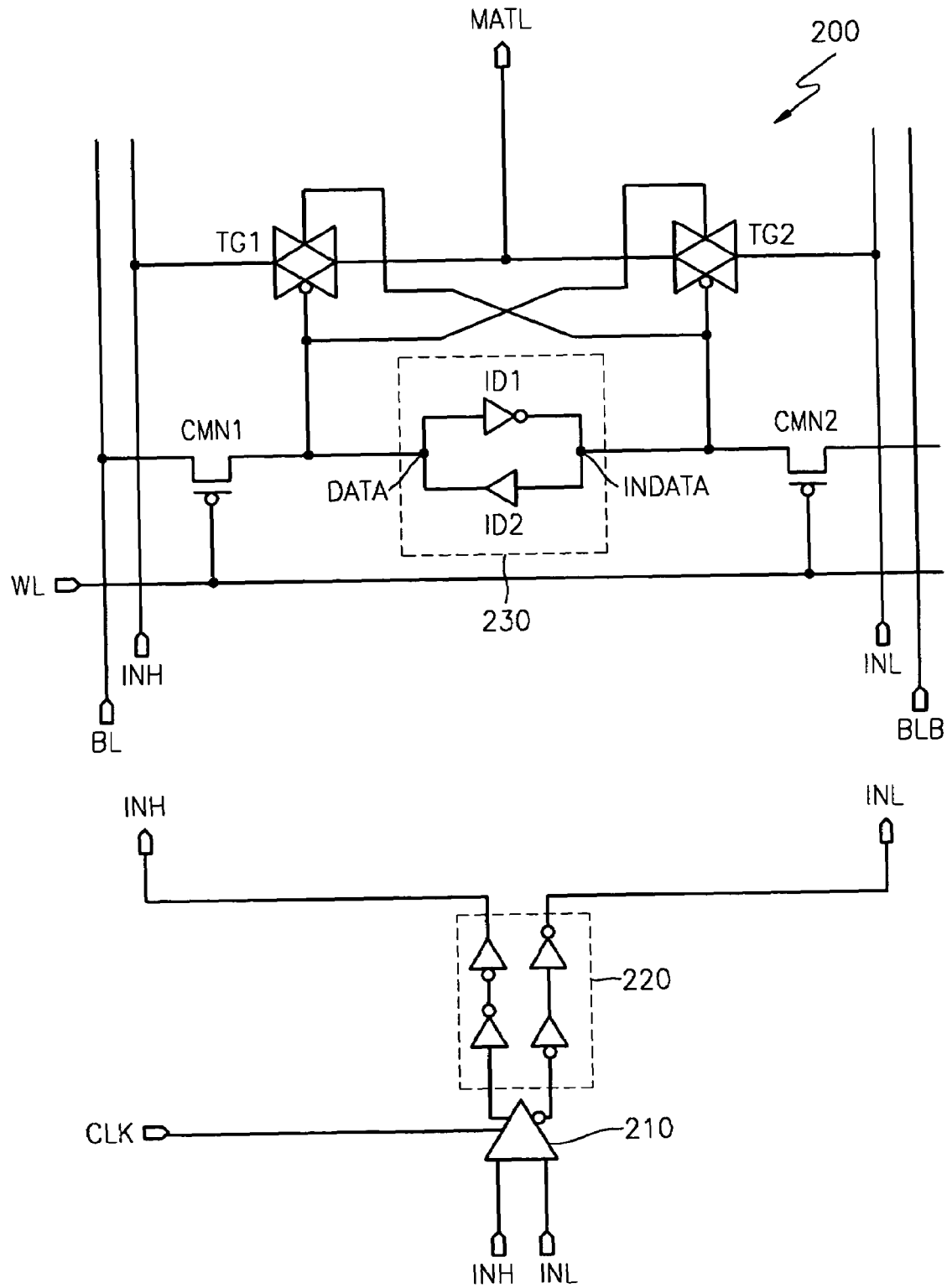
FIG. 2 illustrates a conventional a circuit diagram of a general bit comparator.

In order to solve this problem, the bit comparator 900 of FIG. 9 uses a sense amplifying circuit according to an exemplary embodiment of the present invention instead of the sense amplifying circuit 210 of FIG. 2. The sense amplifying circuit according to an exemplary embodiment of the present invention is part of the bit comparator 900.

Address data input to the bit comparator 900 is a first pair of signals input to the sense amplifying circuit. The first pair of signals are inverted and then input as a second pair of signals to the sense amplifying circuit. The bit comparator 900 can reduce the time required for comparing the address data with data stored therein and amplifying the address data. Accordingly, a cache memory having the bit comparator 900 can operate at a high speed.

The operation of the bit comparator 900 of FIG. 9 will now be described. The RAM cell 905 receives the data DATA and the inverted data INDATA from the pair of bit lines BL and BLB via the first and second control transistors CMN1 and CMN2 and stores the data DATA and the inverted data INDATA in the data maintainer 906. When the first and second control transistors CMN1 and CMN2 are turned on in response to the control signal CS, the data DATA and the inverted data INDATA is applied to the data maintainer 906. The control signal CS is controlled by a word line WD.

The structures of the selecting unit 910, the sensing unit 920, the latching unit 930, and the output unit 940 are substantially equal to those of the sensing unit 610, the sensing unit 620, the latching unit 630, and the output unit 640. In other words, the comparator 900 of FIG. 9 includes a combination of the sense amplifying circuit 600 and the RAM cell 905.

When the data DATA is at a low level and the inverted data INDATA is at a high level, the data DATA is applied as the selection signal SEL to a first select transistor SMN1 and the inverted data INDATA is applied as the inverted selection signal ISEL to a second select transistor SMN2.

When the clock signal CLK is at a high level, the second select transistor SMN2 is turned on. Thus, the second sense transistor MN2 having the gate to which the second signal INH2 is applied and the second inverted sense transistor IMN2 having the gate to which the second inverted signal INL2 is applied are turned on.

When the voltage level of the first signal INH1 is higher than the voltage level of the first inverted signal INL1, since the second inverted signal INL2 is equal to the first signal INH1, the second inverted sense transistor IMN2 allows a larger amount of current to flow than the second sense transistor MN2. Thus, a voltage level of the second node N2 becomes lower than a voltage level of the first node N1. The output unit 940 outputs the second output signal OUTL having a higher voltage level than the first signal OUTH.

A high level of the second output signal OUTL of the first and second output signals OUTH and OUTL of the bit comparator 900 indicates that the data DATA and the inverted data INDATA stored in the RAM cell 905 have a different level from the first signal INH1 and the first inverted signal INL1 input to the bit comparator 900, i.e., the address data.

In contrast, a low level of the second output signal OUTL indicates that the data DATA and the inverted data INDATA stored in the RAM cell 905 have the same level as the first signal INH1 and the first inverted signal INL1 input to the bit comparator 900, i.e., the address data.

In the above example, when the second output signal OUTL is at the high level, the address data input to the bit comparator 900, i.e., the first signal INH1 and the first inverted signal INL1, does not coincide with the data DATA and the inverted data INDATA stored in the data maintainer 906.

As described above, the bit comparator 900 of FIG. 9 includes the sense amplifying circuit according to an exemplary embodiment of the present invention. Thus, compared to the bit comparator 200, the bit comparator 900 can considerably reduce the time required for comparing address data with stored data.

The bit comparator 900 of FIG. 9 includes a combination of the RAM cell 905 and the sense amplifying circuit 600 of FIG. 6. However, it will be understood by those of ordinary skill in the art that the bit comparator 900 may include a combination of the RAM cell 905 and the sense amplifying circuit 700 of FIG. 7 or a combination of the RAM cell 905 and the sense amplifying circuit 800 of FIG. 8.

Figure 10:
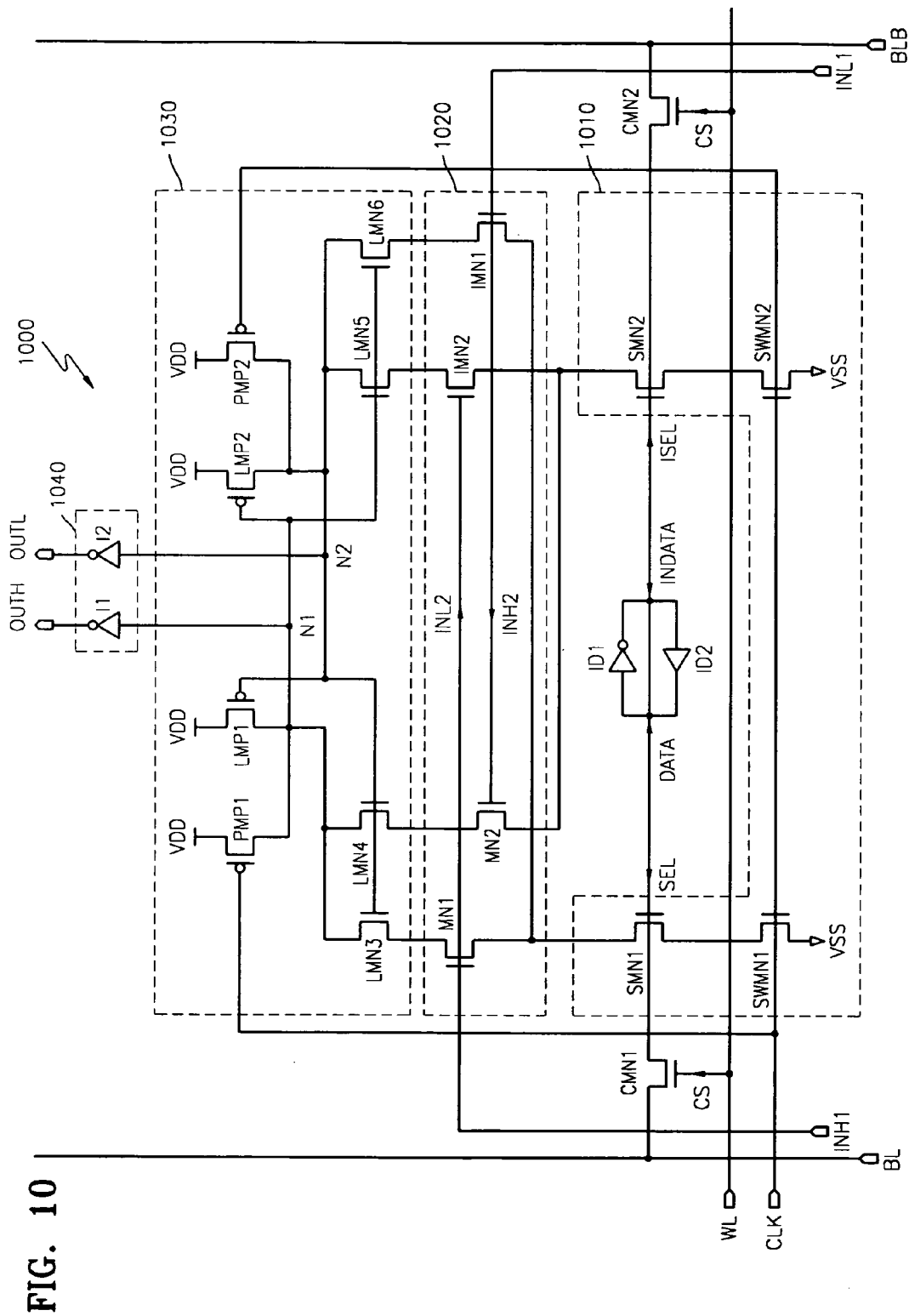
FIG. 10 illustrates a modified circuit diagram of the bit comparator of FIG. 9.

FIG. 10 illustrates a modified circuit diagram of the bit comparator of FIG. 9.

A bit comparator 1000 of FIG. 10 includes a combination of a RAM cell and the sense amplifying circuit 300 of FIG. 3. It is obvious to those of ordinary skill in the art that the operation of the bit comparator 1000 is substantially the same as the operation of the bit comparator 900 of FIG. 9. Thus, details of the operation of the bit comparator 1000 will not be described herein.

The bit comparator 1000 of FIG. 10 includes the combination of the RAM cell and the sense amplifying circuit 300 of FIG. 3. However, it is understood by those of ordinary skill in the art that the bit comparator 1000 may include a combination of the RAM cell and the sense amplifying circuit 400 of FIG. 4 or a combination of the RAM cell and the sense amplifying circuit 500 of FIG. 5.

Figure 11:
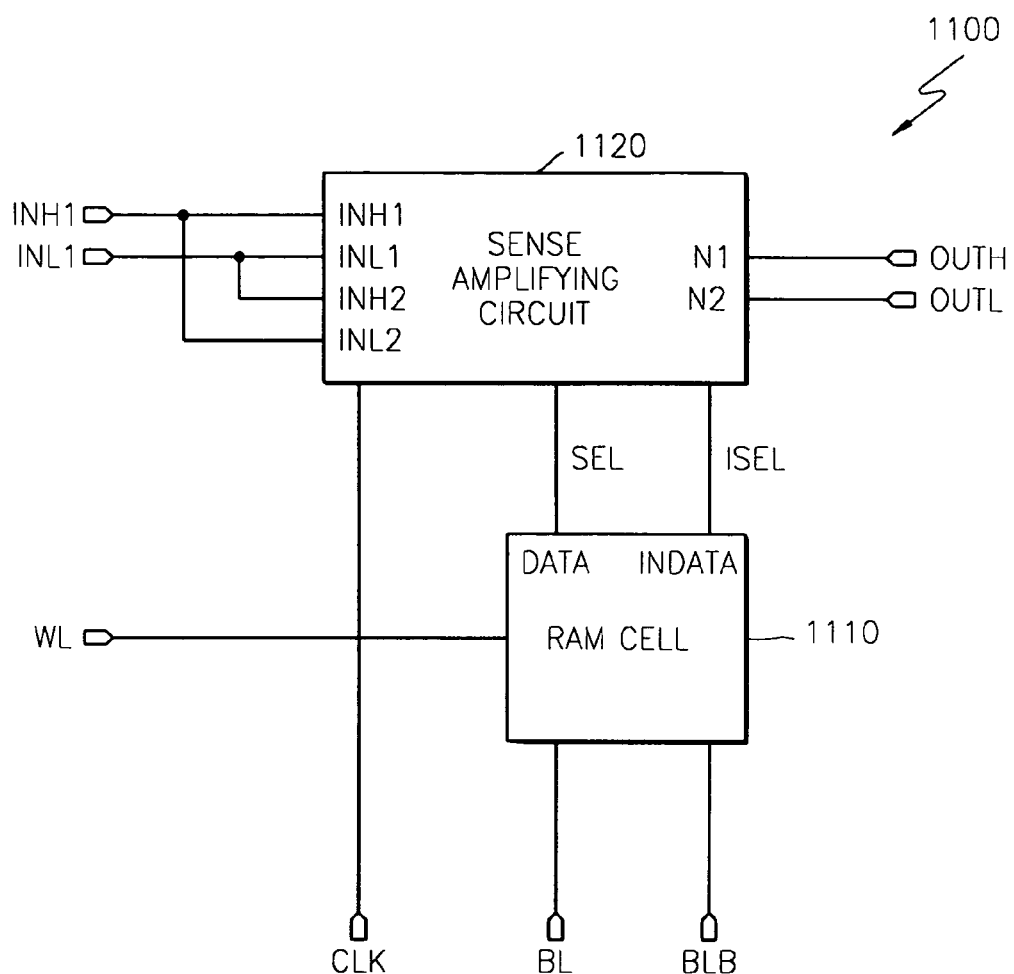
FIG. 11 illustrates a block diagram for explaining the bit comparators of FIGS. 9 and 10.

FIG. 11 illustrates a block diagram for explaining the bit comparators of FIGS. 9 and 10.

A bit comparator 1100 (each of the bit comparators 900 and 1000 of FIGS. 9 and 10) includes a combination of a RAM cell 1110 and a sense amplifying circuit 1120. The RAM cell 1110 receives and stores data DATA and inverted data INDATA from a pair of bit lines BL and BLB in response to a control signal controlled by a word line WD, and outputs the data DATA and the inverted data INDATA as a selection signal SEL and an inverted selection signal ISEL, respectively.

The sense amplifying circuit 1120 receives a first signal INH1, a first inverted signal INL1, a second inverted signal INL2 into which the first signal is inverted, and a second signal INH2 into which the first inverted signal INL1 is inverted, and selects the first signal INH1 and the first inverted signal INL1 or the second signal INH2 and the second inverted signal INL2 in response to the selection signal SEL.

The bit comparator 1100 compares voltage levels of the selected signals with voltage levels of the data DATA and the inverted data INDATA to output first and second output signals OUTH and OUTL. The comparator 1100 determines in response to the voltage level of the second output signal OUTL whether the data DATA and the inverted data INDATA stored in the RAM cell 1110 coincide with address data input to the comparator 1100, i.e., the first signal INH1 and the first inverted signal INL1.

The sense amplifying circuit 1120 may be one of the sense amplifying circuits 300, 400, 500, 600, 700, and 800 of FIGS. 3, 4, 5, 6, 7, and 8.

As described above, a sense amplifying circuit according to an exemplary embodiment of the present invention may receive two pairs of differential signals, selects one pair of differential signals from the two pairs of differential signals, and amplifies only the selected pair of differential signals. As a result, a significant logic burden is normally not imposed on a rear end of the sense amplifying circuit. In addition, a bit comparator having the sense amplifying circuit according to an exemplary embodiment of the present invention may generally operate at a high speed. Thus, a high-speed cache memory can be realized.

While the present invention has been described with reference to exemplary embodiments thereof, it will be understood by those skilled in the art that various changes in form and details may be made without departing from the spirit and scope of the present invention as defined by the claims.

What is claimed is:

1. A sense amplifying circuit, comprising:
 a selecting unit for selecting one pair from a first pair of a first signal and a first inverted signal and a second pair of a second signal and a second inverted signal, the selecting unit selecting the one pair in response to a selection signal and an inverted selection signal;
 a sensing unit for sensing voltage levels of one pair of signals selected from the first pair and the second pair;
 a latching unit for precharging first and second nodes in response to a clock signal and for controlling voltage levels of the first and second nodes in response to a sensing result of the sensing unit;
 an output unit for inverting the voltage levels of the first and second nodes to generate first and second output signals; and
 a switching unit for controlling the operation of the selecting unit in response to the clock signal.

2. The sense amplifying circuit of claim 1, wherein the latching unit comprises:
 a first precharge transistor including a first end connected to a power voltage, a second end connected to the first node, and a gate connected to the clock signal;
 a second precharge transistor including a first end connected to the power voltage, a second end connected to the second node, and a gate connected to the clock signal;
 a first latch transistor including a first end connected to the power voltage, a second end connected to the first node, and a gate connected to the second node;
 a second latch transistor including a first end connected to the power voltage, a second end connected to the second node, and a gate connected to the first node;
 third and fourth transistors including first ends connected to the first node and gates connected to the second node; and
 fifth and sixth transistors including first ends connected to the second node and gates connected to the first node.

3. The sense amplifying circuit of claim 2, wherein the latching unit further comprises:

a first current pass transistor including a first end connected to the first node, a second end connected to the switching unit, and a gate connected to the second node; and
 a second current pass transistor including a first end connected to the second node, a second end connected to the switching unit, and a gate connected to the first node.

4. The sense amplifying circuit of claim 2, wherein the sensing unit comprises:
 a first sense transistor including a first end connected to a second end of the third latch transistor and a gate connected to the first signal;
 a first inverted sense transistor including a first end connected to a second end of the sixth latch transistor and a gate connected to the first inverted signal;
 a second sense transistor including a first end connected to a second end of the fourth latch transistor and a gate connected to the second signal; and
 a second inverted sense transistor including a first end connected to a second end of the fifth latch transistor and a gate connected to the first inverted signal.

5. The sense amplifying circuit of claim 4, wherein the selecting unit comprises:
 a first select transistor including a first end connected to a second end of the first sense transistor and a second end of the first inverted sense transistor, a gate connected to the selection signal, and a second end connected to a third node; and
 a second select transistor including a first end connected to the second end of the second sense transistor and the second end of the second inverted sense transistor, a gate connected to the inverted selection signal, and a second end connected to the third node.

6. The sense amplifying circuit of claim 4, wherein the selecting unit comprises:
 a first select transistor including a first end connected to a second end of the first sense transistor, a gate connected to the selection signal, and a second end connected to the third node;
 a first inverted select transistor including a first end connected to a second end of the first inverted sense transistor, a gate connected to the selection signal, and a second end connected to the third node;
 a second select transistor including a first end connected to a second end of the second sense transistor, a gate connected to the inverted selection signal, and a second end connected to the third node; and
 a second inverted select transistor including a first end connected to a second end of the second inverted sense transistor, a gate connected to the inverted selection signal, and a second end connected to the third node.

7. The sense amplifying circuit of claim 5, wherein the switching unit is a switch transistor that includes a first end connected to the third node, a gate connected to the clock signal, and a second end connected to a ground voltage.

8. The sense amplifying circuit of claim 7, wherein the first and second precharge transistors and the first and second latch transistors are PMOS transistors, and the third through sixth latch transistors, the first and second sense transistors, the first and second inverted sense transistors, the first and second select transistors, the first and second inverted select transistors, and the switch transistor are NMOS transistors.

9. A sense amplifying circuit comprising:
 a selecting unit for selecting one pair from a first pair of a first signal and a first inverted signal and a second pair of a second signal and a second inverted signal, in response to a first level of a clock signal, a selection signal, and an inverted selection signal;

a sensing unit for sensing voltage levels of one pair of signals selected from the first and second pairs;

a latching unit for precharging first and second nodes in response to a second level of the clock signal and controlling voltage levels of the first and second nodes in response to a sensing result of the sensing unit; and an output unit for inverting the voltage levels of the first and second nodes to generate first and second output signals.

10. The sense amplifying circuit of claim 9, wherein the latching unit comprises:

a first precharge transistor including a first end connected to a power voltage, a second end connected to the first node, and a gate connected to the clock signal;

a second precharge transistor including a first end connected to the power voltage, a second end connected to the second node, and a gate connected to the clock signal;

a first latch transistor including a first end connected to the power voltage, a second end connected to the first node, and a gate connected to the second node;

a second latch transistor including a first end connected to the power voltage, a second end connected to the second node, and a gate connected to the first node;

third and fourth transistors including first ends connected to the first node and gates connected to the second node; and fifth and sixth transistors including first ends connected to the second node and gates connected to the first node.

11. The sense amplifying circuit of claim 10, wherein the sensing unit comprises:

a first sense transistor including a first end connected to a second end of the third latch transistor and a gate connected to the first signal;

a first inverted sense transistor including a first end connected to a second end of the sixth latch transistor and a gate connected to the first inverted signal;

a second sense transistor including a first end connected to a second end of the fourth latch transistor and a gate connected to the second signal; and a second inverted sense transistor including a first end connected to a second end of the fifth latch transistor and a gate connected to the first inverted signal.

12. The sense amplifying circuit of claim 11, wherein the selecting unit comprises:

a first switch transistor including a first end connected to a second end of the first sense transistor and a second end of the first inverted sense transistor, and a gate connected to the clock signal;

a second switch transistor including a first end connected to a second end of the second sense transistor and a second end of the second inverted sense transistor, and a gate connected to the clock signal;

a first select transistor including a first end connected to a second end of the first switch transistor, a gate connected to the selection signal, and a second end connected to a ground voltage; and a second select transistor including a first end connected to a second end of the second switch transistor, a gate connected to the inverted selection signal, a second end connected to the ground voltage.

13. The sense amplifying circuit of claim 11, wherein the selecting unit comprises:

a first switch transistor including a first end connected to a second end of the first sense transistor and a gate connected to the clock signal;

a first inverted switch transistor including a first end connected to a second end of the first inverted sense transistor and a gate connected to the clock signal;

a second switch transistor including a first end connected to a second end of the second sense transistor and a gate connected to the clock signal;

a second inverted switch transistor that comprises a first end connected to a second end of the second inverted sense transistor and a gate connected to the clock signal;

a first select transistor including a first end connected to second ends of the first switch transistor and the first inverted switch transistor, a gate connected to the selection signal, and a second end connected to the ground voltage; and a second select transistor including a first end connected to second ends of the second switch transistor and the second inverted switch transistor, a gate connected to the inverted selection signal, and a second end connected to the ground voltage.

14. The sense amplifying circuit of claim 11, wherein the selecting unit comprises:

a first switch transistor including a first end connected to a second end of the first sense transistor and a gate connected to the clock signal;

a first inverted switch transistor including a first end connected to a second end of the first inverted sense transistor and a gate connected to the clock signal;

a second switch transistor including a first end connected to a second end of the second sense transistor and a gate connected to the clock signal;

a second inverted switch transistor including a first end connected to a second end of the second inverted sense transistor and a gate connected to the clock signal;

a first select transistor including a first end connected to a second end of the first switch transistor, a gate connected to the selection signal, and a second end connected to the ground voltage;

a first inverted select transistor including a first end connected to a second end of the first inverted switch transistor, a gate connected to the selection signal, and a second end connected to the ground voltage;

a second select transistor including a first end connected to a second end of the second switch transistor, a gate connected to the inverted selection signal, and a second end connected to the ground voltage; and a second inverted select transistor including a first end connected to a second end of the second inverted switch transistor, a gate connected to the inverted selection signal, a second end connected to the ground voltage.

15. The sense amplifying circuit of claim 14, wherein the first and second precharge transistors and the first and second latch transistors are PMOS transistors, and the third through sixth latch transistors, the first and second sense transistors, the first and second inverted sense transistors, the first and second select transistors, the first and second inverted select transistors, and the first through fourth switch transistors are NMOS transistors.

16. A bit comparator comprising:

a random access memory cell for receiving and storing data and inverted data having an opposite level to the data from a pair of data lines to generate a selection signal and an inverted selection signal in response to a control signal;

a selecting unit for selecting one pair from a first pair of first signal and first inverted signal and a second pair of second signal and second inverted signal in response to a first level of a clock signal, the selection signal, and the inverted selection signal;

a sensing unit for sensing voltage levels of one pair of signals selected from the first and second pairs;

a latching unit for precharging first and second nodes in response to a second level of the clock signal and controls voltage levels of the first and second nodes in response to a sensing result of the sensing unit; and an output unit for inverting the voltage levels of the first and second nodes to generate first and second output signals and determining in response to a level of the second output signal whether the data and the inverted data coincide with the first signal and the first inverted signal.

17. The bit comparator of claim 16, wherein the random access memory cell comprises:

a data maintainer including first and second inverters, an output of the first inverter being connected to an input of the second inverter and an input of the first inverter being connected to an output of the second inverter;

a first control transistor for transmitting the data to an input node of the first inverter via one of the pair of data lines in response to the control signal; and a second control transistor for transmitting the inverted data to an input node of the second inverter via the other one of the pair of data lines in response to the control signal, wherein the pair of data lines is a pair of bit lines.

18. The bit comparator of claim 16, wherein the data is equal to the selection signal, the inverted data is equal to the inverted selection signal, the first signal is equal to the second inverted signal, the second signal is equal to the first inverted signal, and the first signal and the first inverted signal have opposite levels and are address data input to the bit comparator.

19. The bit comparator of claim 16, wherein in the sensing unit, when the clock signal and the selection signal are at a first level, a first sense transistor includes a gate to which the first signal is applied and a first inverted sense transistor comprising a gate to which the first inverted signal is applied are turned on and a source of the first sense transistor is connected to a source of the first inverted sense transistor, and when the clock signal and the inverted selection signal are at the first level, a second sense transistor includes a gate to which the second signal is applied and a second inverted sense transistor comprising a gate to which the second inverted signal is applied are turned on and a source of the second sense transistor is connected to a source of the second inverted sense transistor.

20. The bit comparator of claim 19, wherein the selecting unit comprises:

a first switch transistor including a first end connected to sources of the first sense transistor and the first inverted sense transistor and a gate connected to the clock signal;

a second switch transistor including a first end connected to sources of the second sense transistor and the second inverted sense transistor and a gate connected to the clock signal;

a first select transistor including a first end connected to a second end of the first switch transistor, a gate connected to the selection signal, and a second end connected to a ground voltage; and a second select transistor including a first end connected to a second end of the second switch transistor, a gate connected to the inverted selection signal, and a second end connected to the ground voltage.

21. The bit comparator of claim 19, wherein the selecting unit comprises:

a first select transistor including a first end connected to sources of the first sense transistor and the first inverted sense transistor and a gate connected to the selection signal;

a second select transistor including a first end connected to sources of the second sense transistor and the second inverted sense transistor and a gate connected to the inverted selection signal;

a first switch transistor including a first end connected to a second end of the first select transistor, a gate connected to the clock signal, and a second end connected to a ground voltage; and a second switch transistor including a first end connected to a second end of the second select transistor, a gate connected to the clock signal, and a second end connected to the ground voltage.

22. The sense amplifying circuit of claim 6, wherein the switching unit is a switch transistor includes a first end connected to the third node, a gate connected to the clock signal, and a second end connected to a ground voltage.

23. An apparatus, comprising:

a selecting unit for selecting a signal pair from at least two pairs of signals, the selecting unit selecting the signal pair based upon at least one selection signal;

a sensing unit for sensing voltage levels of one pair of signals selected from the at least two pairs; and a latching unit for precharging first and second nodes in response to a clock signal and controlling voltage levels of the first and second nodes in response to a sensing result of the sensing unit.

24. The apparatus according to claim 23, wherein the selecting unit selects the signal pair based upon a selection signal and an inverted selection signal.

25. The apparatus according to claim 24, wherein the inverted selection signal is obtained by inverting the selection signal.

26. A method, comprising:

selecting a signal pair from at least two pairs of signals based upon at least one selection signal;

sensing voltage levels of the selected signal pair;

precharging first and second nodes in response to a clock signal;

controlling the voltage levels of the first and second nodes in response to the sensing; and amplifying only the signal pair selected from the at least two pairs of signals.

27. The apparatus according to claim 23, further comprising:

an output unit for inverting the voltage levels of the first and second nodes to generate first and second output signals; and a switching unit for controlling the operation of the selecting unit in response to the clock signal.

28. The method according to claim 26, further comprising:

inverting the voltage levels of the first and second nodes to generator first and second output signals; and controlling the operation of the selecting unit in response to the clock signal.

* * * * *